(12) United States Patent
Spessot et al.

(10) Patent No.: US 9,711,214 B2
(45) Date of Patent: *Jul. 18, 2017

(54) METHODS, ARTICLES AND DEVICES FOR PULSE ADJUSTMENTS TO PROGRAM A MEMORY CELL

(71) Applicant: MICRON TECHNOLOGY, INC., Boise, ID (US)

(72) Inventors: Alessio Spessot, Leuven (BE); Paolo Fantini, Vimercate (IT); Massimo Ferro, Camisano (IT)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/941,365

(22) Filed: Nov. 13, 2015

(65) Prior Publication Data

US 2016/0172030 A1 Jun. 16, 2016

Related U.S. Application Data

(63) Continuation of application No. 13/466,851, filed on May 8, 2012, now Pat. No. 9,218,876.

(51) Int. Cl.
*G11C 11/00* (2006.01)
*G11C 13/00* (2006.01)

(52) U.S. Cl.
CPC ...... *G11C 13/0064* (2013.01); *G11C 13/0002* (2013.01); *G11C 13/0004* (2013.01); *G11C 13/004* (2013.01); *G11C 13/0069* (2013.01); *G11C 2013/0066* (2013.01); *G11C 2013/0076* (2013.01); *G11C 2013/0083* (2013.01); *G11C 2013/0092* (2013.01)

(58) Field of Classification Search
CPC ............ G11C 13/0069; G11C 13/0004; G11C 13/0007
USPC ................................ 365/148, 185.19, 185.09
See application file for complete search history.

(56) References Cited

U.S. PATENT DOCUMENTS

| | | | |
|---|---|---|---|
| 5,751,637 A | 5/1998 | Chen et al. | |
| 6,888,745 B2 | 5/2005 | Ehiro et al. | |
| 7,151,701 B2 | 12/2006 | Combe et al. | |
| 7,391,642 B2 | 6/2008 | Gordon et al. | |
| 7,440,315 B2 | 10/2008 | Lung | |
| 7,515,460 B2 | 4/2009 | Gordon et al. | |
| 7,522,449 B2 | 4/2009 | Ro et al. | |
| 7,593,255 B2* | 9/2009 | Happ | G11C 11/5678 365/148 |
| 7,679,980 B2 | 3/2010 | Happ et al. | |
| 7,719,874 B2 | 5/2010 | Scheuerlein et al. | |
| 7,885,101 B2 | 2/2011 | Bedeschi et al. | |

(Continued)

FOREIGN PATENT DOCUMENTS

KR 2009-0097726 9/2009

OTHER PUBLICATIONS

U.S. Appl. No. 13/275,901, filed Oct. 18, 2011 in 28 pages.

(Continued)

*Primary Examiner* — Son Dinh
(74) *Attorney, Agent, or Firm* — Holland & Hart LLP

(57) ABSTRACT

Embodiments disclosed herein may relate to adjusting an aspect of a programming pulse for one or more memory cells, such as based at least in part on one or more detected programmed resistance values for the one or more memory cells.

20 Claims, 5 Drawing Sheets

(56) References Cited

U.S. PATENT DOCUMENTS

| | | |
|---|---|---|
| 7,894,237 B2 | 2/2011 | Karpov et al. |
| 7,898,847 B2 | 3/2011 | Philipp |
| 7,929,336 B2 | 4/2011 | Philipp et al. |
| 7,944,740 B2 | 5/2011 | Lam et al. |
| 7,952,919 B2 | 5/2011 | Liu et al. |
| 8,000,127 B2 | 8/2011 | Hamilton et al. |
| 8,036,014 B2 | 10/2011 | Lee et al. |
| 8,144,525 B2 | 3/2012 | Macerola et al. |
| 8,149,608 B2 | 4/2012 | Lee |
| 8,149,625 B2 | 4/2012 | Hwang |
| 8,456,913 B2 | 6/2013 | An |
| 9,218,876 B2 * | 12/2015 | Spessot .............. G11C 13/0002 |
| 2009/0052235 A1 | 2/2009 | Horil et al. |
| 2009/0052236 A1 | 2/2009 | Bae et al. |
| 2009/0231912 A1 | 9/2009 | Liu |
| 2010/0012913 A1 | 1/2010 | Lee |
| 2010/0284212 A1 | 11/2010 | Bedeschi et al. |
| 2011/0051508 A1 | 3/2011 | Eleftheriou et al. |
| 2011/0051521 A1 | 3/2011 | Levy et al. |
| 2011/0069539 A1 | 3/2011 | Eleftheriou et al. |
| 2011/0122685 A1 | 5/2011 | Kang et al. |
| 2012/0147667 A1 | 6/2012 | Chen |
| 2013/0301334 A1 | 11/2013 | Spessot et al. |

OTHER PUBLICATIONS

U.S. Appl. No. 13/286,375, filed Nov. 11, 2011 in 27 pages.
U.S. Appl. No. 13/597,639, filed Aug. 29, 2012 in 22 pages.
U.S. Appl. No. 13/597,692, filed Aug. 29, 2012 in 22 pages.

* cited by examiner

METHODS, ARTICLES AND DEVICES FOR PULSE ADJUSTMENTS TO PROGRAM A MEMORY CELL

CROSS-REFERENCE TO RELATED APPLICATION

This application is a continuation of U.S. patent application Ser. No. 13/466,851, filed on May 8, 2012 and titled "METHODS, ARTICLES AND DEVICES FOR PULSE ADJUSTMENTS TO PROGRAM A MEMORY CELL," the entire disclosure of which is incorporated by reference herein.

FIELD

Subject matter disclosed herein may relate to integrated circuit devices, and may relate, more particularly, to memory type circuitry.

INFORMATION

Integrated circuit devices, such as memory devices, for example, may be found in a wide range of electronic devices. For example, memory devices may be used in computers, digital cameras, cellular telephones, personal digital assistants, etc. Factors related to a memory device that may be of interest to a system designer in considering suitability for any particular application may include, physical size, storage density, operating voltages, granularity of read/write operations, throughput, transmission rate, and/or power consumption, for example. Other example factors that may be of interest to system designers may include cost of manufacture, ease of manufacture, and/or reliability.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Reference is made in the following detailed description to accompanying drawings, which form a part hereof, wherein like numerals may designate like parts throughout to indicate corresponding and/or analogous components. It will be appreciated that components illustrated in the figures have not necessarily been drawn to scale, such as for simplicity and/or clarity of illustration. For example, dimensions of some components may be exaggerated relative to other components. Further, it is to be understood that other embodiments may be utilized. Furthermore, structural and/or other changes may be made without departing from the scope of claimed subject matter. It should also be noted that directions and/or references, for example, up, down, top, bottom, and so on, may be used to facilitate discussion of drawings and/or are not intended to restrict application of claimed subject matter. Therefore, the following detailed description is not to be taken to limit the scope of claimed subject matter and/or equivalents.

DETAILED DESCRIPTION

Integrated circuit devices, such as non-volatile memory devices, may be found in a wide range of electronic devices. Non-volatile memory devices may be used in computers, digital cameras, cellular telephones, and/or personal digital assistants, to name but a few examples. Factors related to a memory device that may be of interest in considering suitability for a particular application may include physical size, storage density, operating voltages, granularity of read/write operations, throughput, transmission rate, and/or power consumption. Other example factors that may be of interest may include cost of manufacture, and/or ease of manufacture.

Figure 1:
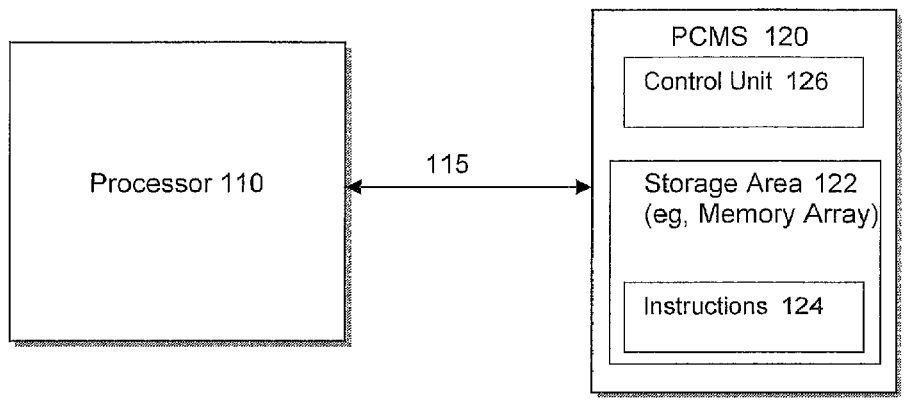
FIG. 1 is a schematic diagram depicting an example computing platform including a phase change memory (PCM) device, according to an embodiment.

FIG. 1 is a schematic diagram depicting a device in the form of an example computing platform 100 including an example phase change memory with selector (PCMS) device 120. In an embodiment, PCMS device 120 may comprise a storage area 122, including a memory array, such as an array of PCMS cells, in accordance with one or more examples. PCMS device 120 may, in an example embodiment, be coupled to a processor 110, such as by way of an interconnect 115.

PCMS device 120 in an embodiment may comprise a control unit 126. Additionally, storage area 122 may store instructions 124 that may include one or more applications that may be executed by processor 110, in accordance with an embodiment. Processor 110 may transmit a memory access command to PCMS device 120, for example. Control unit 126 may access one or more memory cells of storage area 122 at least in part in response to receiving the memory access command from processor 110, according to an embodiment. Of course, computing platform 100 is merely one illustrative example of a device implemented in accordance with claimed subject matter, and the scope of claimed subject matter is therefore not limited in these respects.

In an embodiment, one or more phase change memory (PCM) cells of memory array 122 may comprise a chalcogenide glass material. A memory device, such as device 120, may store (e.g., retain) information by programming a memory cell to a selected one of at least two states. For example, in a binary system, states may be considered a "0" or a "1." In an embodiment, a "set" state, representing a binary value of "1," for example, may correspond to a more crystalline, more conductive state of a material for a memory cell, such as one or more memory cells of memory array 122. Also, in an embodiment, a "reset" state, representing a binary value of "0," for example, may correspond to a more amorphous, more resistive state of a material for a memory cell, such as one or more memory cells of memory array 122. In other systems, at least some individual memory components may have a configuration to store information by programming a memory cell to a selected one of more than two levels or states. In a PCM device, such as PCMS device 120, heat sufficient to change a state (e.g., phase) of an individual memory cell, such as an individual cell of memory array 122, may be achieved using an electrical pulse, such as a voltage pulse or a current pulse, for example, to program a memory cell, such as one or more memory cells of memory array 122, in an embodiment. For example, heat may be generated as a result of current flow through a memory cell, which may result from use of an electrical pulse, for example. Further, in one or more example embodiments, memory arrays may comprise one or more technologies other than PCM, such as other resistive memory technologies and/or other types of memory. Claimed subject matter is not limited in scope to illustrative examples, such as these, of course.

In an example embodiment, heat sufficient to change a state of a memory cell, such as one or more PCM cells of memory array 122, may be provided, at least in part, by a current flowing through a memory cell. In an embodiment, a current may flow through a PCM cell, such as one or more cells of memory array 122, at least in part as a result of a voltage across electrically conductive electrodes in electrical contact with one or more memory cells, for example.

In an embodiment, an amount of current to flow through a PCM cell, such as one or more cells of memory array 122, may depend at least in part on a resistance of a PCM cell, such as one or more cells of memory array 122. In an embodiment, a PCM cell, such as one or more cells of memory array 122, for example, may have different resistance states depending at least in part on whether a memory cell is programmed to a more conductive, set state or to a more resistive, reset state, although claimed subject matter is, again, not limited in scope to an illustrative embodiment, such as 122, for example.

In an embodiment, a state of a PCM cell may be detected based at least in part on a ratio of a resistance of the cell in a reset state to a resistance of the cell in a set state. A ratio may be expressed as:

$$R_{reset}/R_{set} \quad (1)$$

wherein $R_{set}$ comprises a resistance of a PCM cell, such as one or more cells of memory array 122, in a set state, and wherein $R_{reset}$ comprises a resistance of a PCM cell, such as one or more cells of memory array 122, in a reset state.

As may be seen in expression (1) above, a reset/set resistance ratio for a PCM cell may depend at least in part on resistance values for a cell, such as one or more cells of memory array 122, in a more conductive, set state and in a more resistive, reset state. In an embodiment, higher reset/set resistance ratios may be desirable to provide more reliable detection of an intended state for a particular memory cell. Additionally, in an embodiment, intermediate states may exist for a memory cell whereby a particular memory cell, such as one or more memory cells of memory array 122, may be in a state between a more conductive set state and a more resistive reset state. For example, under some conditions, a PCM cell may have a lower resistance value than a target resistance value for a memory cell in a reset state. In an embodiment, a lower resistance state may be referred to as an "over-reset" state, although claimed subject matter is not limited in scope in this respect. In an embodiment, an "over-reset" state may comprise a state whereby a PCM cell is less resistive than in a reset state, but less conductive than in a set state. An ability to detect an over-reset state for a PCM cell may provide one or more advantages, including an ability to adjust aspects of a pulse to program the cell, for example. In an embodiment, a programming electrical (e.g., voltage and/or current) pulse may be adjusted to provide improved reliability, reduced power consumption, and/or increased system performance, for example. Adjustments to programming electrical pulses may be initiated on a periodic basis and/or may be initiated by a user, for example. Adjustments to programming electrical pulses may also be initiated in response to PCM cell error conditions, in an embodiment.

Figure 2:
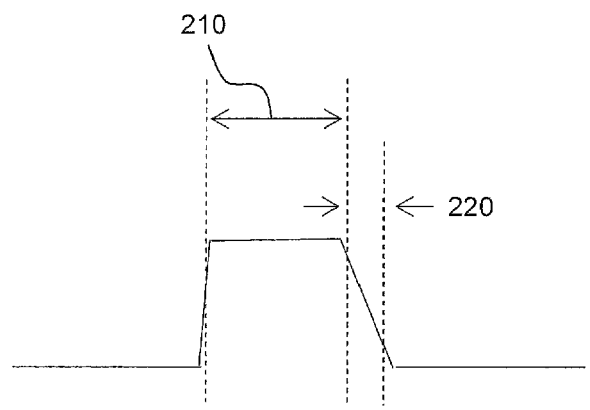
FIG. 2 is an illustration depicting an example electrical pulse to program a memory cell, according to an embodiment.

FIG. 2 is an illustration of an example waveform 200 depicting a reset pulse, such as for an example embodiment of a PCM cell, to program a reset state of the cell. In an embodiment, to melt PCM cell material, a pulse 210 with a magnitude sufficient to impart melting of at least a portion of a PCM cell may be employed. Also depicted in FIG. 2 is fall time 220. In an embodiment, a "fall time" may refer to an amount of time for a signal level of a waveform to fall from a first level to a second level. For example, a voltage pulse to program a reset state of a memory cell may employ a time to fall from a level of approximately 90% of a peak amplitude to a level of approximately 10% of a peak amplitude as a fall time, for example. However, claimed subject matter is not limited in scope to an illustrative embodiment, such as waveform 200. In an embodiment, for an example reset pulse, a fall time may comprise approximately 10 to 50 ns, although claimed subject matter is not limited in scope in this respect. In an embodiment, a reset pulse may be characterized, at least in part, by a programming voltage pulse of sufficient magnitude and/or duration to melt PCM material, followed by a relatively abrupt falling of voltage level to allow for a relatively quick cooling of PCM material. A relatively quick cooling of PCM material, however, may not allow for substantial formation of a crystalline structure within PCM material so that an amorphous state for PCM material may result. In an embodiment, a longer fall time for a reset programming voltage pulse may result in a less resistive state for a PCM cell as compared with a shorter fall time for a reset programming voltage pulse. By adjusting fall times for reset programming voltage pulses, varying resistivity characteristics for a PCM cell may be achieved.

Figure 3:
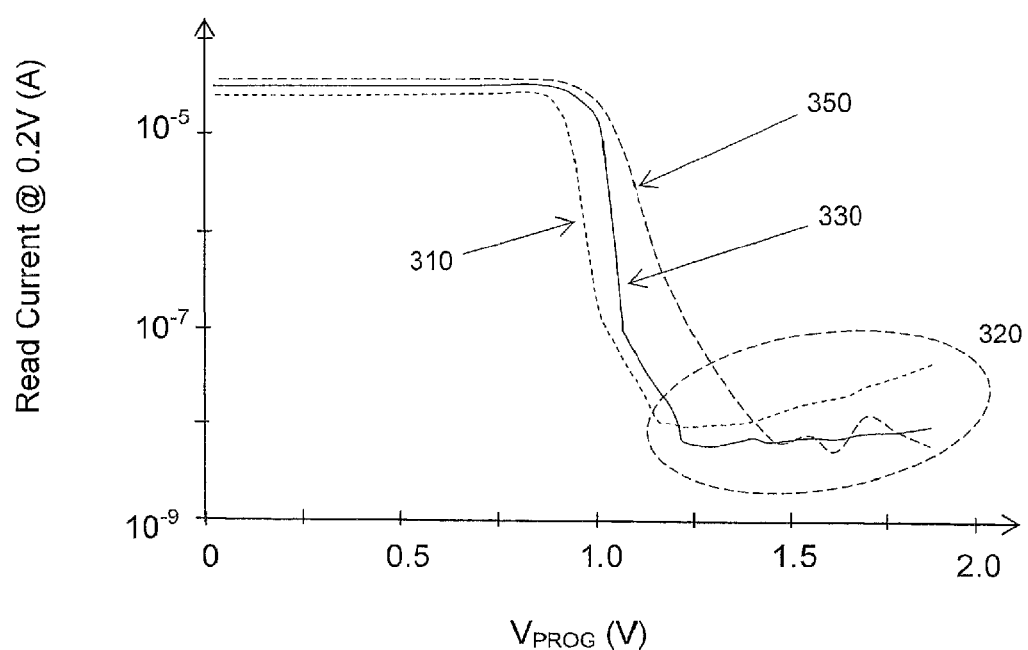
FIG. 3 is an illustration depicting example voltage to current characteristics associated with example voltage pulses to program one or more memory cells, according to an embodiment.

FIG. 3 is an illustration depicting example voltage to current characteristics associated with example programming voltage pulses for one or more memory cells, according to an embodiment. In FIG. 3, a curve 310 represents example current/voltage characteristics for an example PCM cell, such as a cell of memory array 122, having been subjected to a "reset" programming voltage pulse having a trailing edge with a fall time of approximately 10 ns. Curve 330 in FIG. 3 represents example current/voltage characteristics for an example PCM cell, such as a cell of memory array 122, having been subjected to a "reset" programming voltage pulse having a trailing edge with a fall time of approximately 30 ns. Also in FIG. 3, curve 350 represents example current/voltage characteristics for an example PCM cell, such as a cell of memory array 122, having been subjected to a "reset" programming voltage pulse having a trailing edge with a fall time of approximately 50 ns. In an embodiment, example curves 310, 330, and 350 of FIG. 3 represent current levels measured at a PCM cell as a result of having a 0.2 V voltage used to read a state of a PCM cell. In FIG. 3, an "x" axis represents a range of programming voltages. In an embodiment, a PCM cell may be evaluated using a range of programming pulse voltage amplitudes, as well as using several fall times, as depicted in FIG. 3.

In an embodiment, a plot of read current against programming voltage characteristics related to a PCM cell, such as depicted in FIG. 3, may be evaluated to assess resistivity characteristics for a PCM cell. For example, curve 310 in FIG. 3 represents a plot of read current against programming voltage levels for programming voltage pulses with fall times of approximately 10 ns, in an embodiment. In a region 320 of FIG. 3, it may be observed that current/voltage characteristics for a curve 310 with an approximately 10 ns fall time for a programming voltage pulse may differ from current/voltage characteristics for a curve 330 with an approximate 30 ns fall time for a programming voltage pulse, and may also differ from current/voltage characteristics for a curve 350 with an approximate 50 ns fall time for a programming voltage pulse. In an embodiment, a general observation may be made that for longer fall times, a reduced resistivity may result. That is, for reset programming voltage pulses having longer fall times, PCM cells may result having states that are more conductive.

Further, in an embodiment, employing longer fall times for reset programming voltage pulses for PCM cells may result in a decrease in resistivity. Thus, electrical pulse fall times may be adjusted to affect a resistivity of a PCM cell. For example, for one or more PCM cells, such as one or more cells of memory array 122, one or more programming voltage pulses may be applied. A fall time for a programming voltage pulse may be specified. Also, in an embodiment, one or more programmed resistance values related to one or more PCM cells may be detected. Additionally, one or more aspects of a subsequent pulse may be adjusted based at least in part on one or more detected resistance values related to one or more PCM cells. For example, if one or more detected programmed resistance values for one or more PCM cells indicates lower resistivity reset states for one or more PCM cells, subsequent programming pulses may be adjusted to shorten fall times to provide increased resistivity. In an embodiment, by increasing resistivity for PCM cells, such as for reset states, reset/set resistance ratios may be increased to provide improved reliability, for example. Also, by reducing fall times in an example embodiment, power consumption may be reduced in some embodiments. In other embodiments, other aspects of an electrical pulse to program a PCM cell may be adjusted, such as, for example, pulse width, pulse amplitude, and/or pulse shape. Of course, these are merely example pulse aspects that may be adjusted, and claimed subject matter is not limited in scope in these respects.

Although embodiments are described herein wherein longer fall times for reset programming voltage pulses for PCM cells may result in a decrease in resistivity, other embodiments may utilize various materials and/or alloys in a phase change memory material that may result in an increase in resistivity for longer fall times. Claimed subject matter is not limited in scope in these respects.

In an additional embodiment, resistivity characteristics of PCM cells of a memory array may be evaluated periodically over a usable life of a memory device, for example. Over time, resistivity for PCM cells programmed to reset states may experience decreasing resistivity, for example. Decreased resistivity may lead to reduced reliability, in an embodiment. Also in an embodiment, a memory device may perform read operations for one or more PCM cells previously programmed to reset states and may detect one or more programmed resistance values for the one or more PCM cells. Based at least in part on detected programmed resistance characteristics for one or more PCM cells, a memory device may reduce fall times for reset programming pulses to produce memory states exhibiting increased resistivity.

Figure 4:
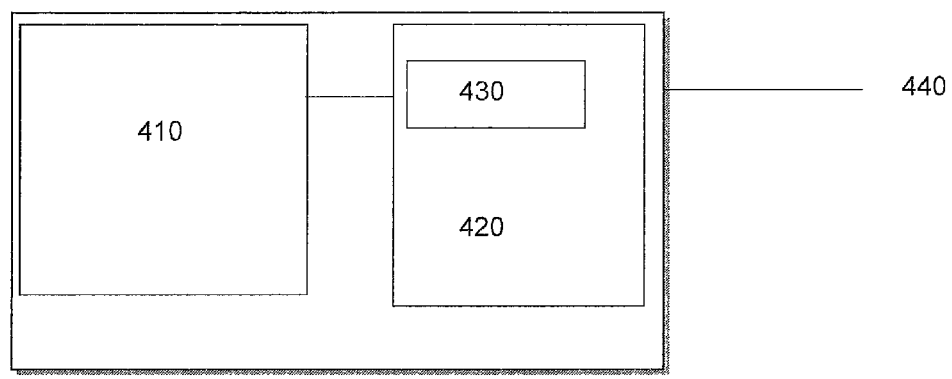
FIG. 4 is an illustration depicting an example device including memory, according to an embodiment.

FIG. 4 is an illustration depicting an embodiment 400 of an example device, which may, for example, include memory. In an embodiment, device 400 may comprise one or more memory cells 410. In an embodiment, cells 410 may comprise PCM cells. Also in an embodiment, device 400 may comprise a pulse generator 420 and a pulse adjustment unit 430, as depicted in FIG. 4. In an embodiment, pulse adjustment unit 430 may be implemented as part of pulse generator 420, although again claimed subject matter is not limited in scope in this respect.

In an embodiment, pulse adjustment unit 430 may comprise a counter and/or a timer, and may initiate pulse adjustment operations on an approximately periodic or other basis to adjust for changing operating conditions and/or to adjust for changes to memory cell physical characteristics, for example. In another embodiment, a signal 440 may be received from an external interface, whereby external circuitry, for example, may detect and/or report memory characteristics, including memory errors. Pulse adjustment unit 430 may evaluate resistivity characteristics of one or more memory cells to assess if an adjustment to programming voltage pulse fall times, as an example, may improve reliability by increasing PCM cell resistivity. In an embodiment, a counter may initiate a programming electrical pulse adjustment operation at least in part in response to an occurrence of a pre-selected amount of memory access cycles, for example. Also, in an embodiment, a device may comprise an error detection unit that may initiate a programming voltage pulse adjustment operation at least in part in response to a detection of a memory cell error. In an embodiment, an error detection unit may be implemented as part of a pulse adjustment unit, although claimed subject matter is not limited in this respect.

Figure 5:
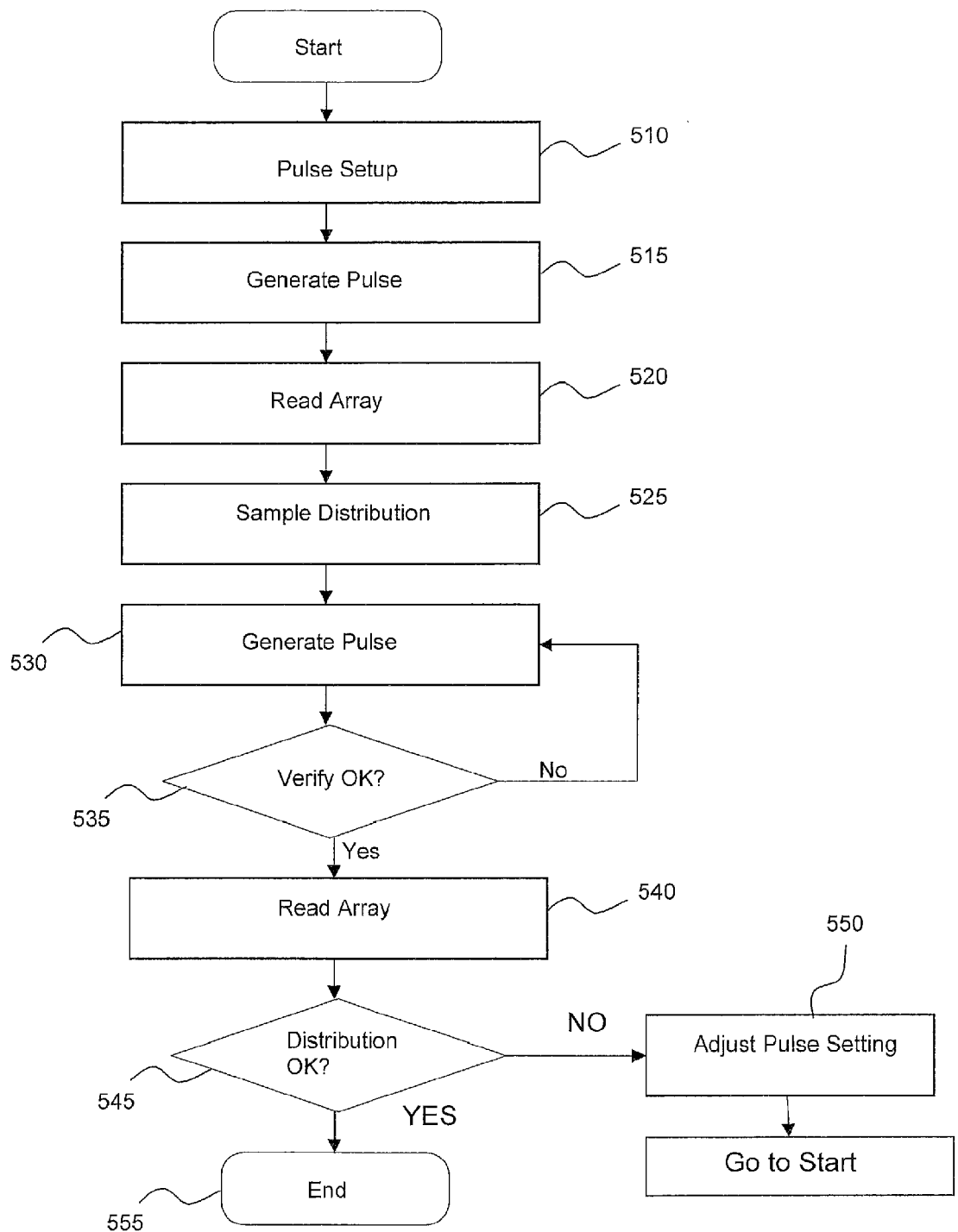
FIG. 5 is a flowchart depicting an example process for adjusting an electrical pulse to program one or more memory cells, according to an embodiment.

FIG. 5 is a flowchart depicting an example process for adjusting an electrical pulse to program one or more memory cells, according to an embodiment. At block 510, an electrical pulse may be set up. For example, aspects for a reset programming pulse may be based, for example, at least in part on circuit test results, in an embodiment. At block 515, a programming pulse may be utilized to program one or more memory cells, such as one or more PCM cells to a reset state, for example. At block 520, one or more memory cells may be read. At block 525, a determination may be made as to a distribution of programmed resistance values, such as related to one or more PCM cells, for example. In an embodiment, for example, a number of programming pulses employed for an array may result in a distribution of values. As utilized herein, the term "distribution" refers to one or more programmed resistance values for one or more cells. "Distribution" may further refer to a difference between target resistance values and measured resistance values for one or more cells. A distribution may relate to measurements of a single memory cell, in an embodiment, and/or may relate to more than one memory cell. A distribution may, therefore, comprise one or more measurements taken in relation to one or more cells. For example, one embodiment may sample a memory cell a single time per programming pulse adjustment operation or period. However, other embodiments may sample a cell several times per programming pulse adjustment operation or period. Claimed subject matter is intended to cover any and all such variations in approaches to arriving at a distribution, such as a sample distribution.

In an embodiment, at block 530, a reset programming pulse may be used for one or more memory cells, such as one or more PCM cells. At block 535, a determination may be made as to whether one or more memory cells are verified as programmed. If a determination is made that one or more memory cells are not verified as correctly programmed, a reset programming pulse, such as a voltage pulse, for example, may be used for one or more memory cells. At block 540, one or more cells of a memory array may be read at least in part in response to a verification obtained at block 535. Also at block 540, a distribution of programmed resistance values for one or more cells may be detected, such as by measuring current as previously described, for example.

Also in an embodiment, at block 545, a determination may be made as to whether a distribution of programmed resistance values determined at block 540 compare favorably with an expected distribution, such as a distribution previously determined, for example, at block 525. If a distribution determined at block 540 compares favorably with an expected distribution at block 525, an example process may end at block 555. Further, at least in part in response to a distribution of detected resistance values varying at least in part from an expected distribution, a programming pulse setting may be adjusted at block 550. For example, if a distribution at block 545 comprises one or more values that are lower in value than an expected distribution, a fall time for a trailing edge of a reset programming pulse, such as a voltage pulse, may be shortened to increase a resistance for one or more cells, such as one or more PCM cells. In this manner, reliability may be maintained and/or improved. In another embodiment, programming time may be decreased by shortening a programming pulse at least in part in response to a distribution of resistance values indicating that a shortening of a programming pulse may yield increased resistance for cells programmed to a reset state. Additionally, an adjustment operation for a programming electrical pulse, such as at block 550, may be initiated at least in part by writing a value indicative of a specified slope of a falling edge of a programming electrical pulse to a programming electrical pulse generator unit. Also, in an embodiment, an adjustment operation may be initiated at least in part in response to receiving an input from a user, although claimed subject matter is not limited in scope in this respect.

The term "computing platform" as used herein refers to a device that includes an ability to process and/or store data in the form of signals and/or states. Thus, a computing platform, in this context, may comprise hardware, software, firmware or any combination thereof (other than software per se). Computing platform 100, as depicted in FIG. 1, is merely one such example, and the scope of claimed subject matter is not limited to this particular example. For one or more embodiments, a computing platform may comprise any of a wide range of digital electronic devices, including, but not limited to, personal desktop or notebook computers, high-definition televisions, digital versatile disc (DVD) players and/or recorders, game consoles, satellite television receivers, cellular telephones, personal digital assistants, mobile audio and/or video playback and/or recording devices, or any combination of the above. Further, unless specifically stated otherwise, a process as described herein, with reference to flow diagrams and/or otherwise, may also be executed and/or controlled, in whole or in part, by a computing platform.

The terms, "and", "or", and "and/or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, and/or characteristic in the singular and/or may be used to describe a plurality or some other combination of features, structures and/or characteristics. Though, it should be noted that this is merely an illustrative example and claimed subject matter is not limited to this example.

Methodologies described herein may be implemented by various techniques depending, at least in part, on applications according to particular features and/or examples. For example, methodologies may be implemented in hardware, firmware, or combinations thereof, along with software (other than software per se). In a hardware implementation, for example, a processing unit may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, or other devices designed to perform functions described herein, or combinations thereof.

In the preceding detailed description, numerous specific details have been set forth to provide a thorough understanding of claimed subject matter. However, it will be understood by those skilled in the art that claimed subject matter may be practiced without these specific details. In other instances, methods and/or devices that would be known by one of ordinary skill have not been described in detail so as not to obscure claimed subject matter.

Some portions of the preceding detailed description have been presented in terms of logic, algorithms and/or symbolic representations of operations on binary states stored within a memory of a specific apparatus or special purpose computing device or platform. In the context of this particular specification, the term specific apparatus or the like includes a general purpose computing device, such as general purpose computer, once it is programmed to perform particular functions pursuant to instructions from program software. Algorithmic descriptions and/or symbolic representations are examples of techniques used by those of ordinary skill in the signal processing and/or related arts to convey the substance of their work to others skilled in the art. An algorithm is here, and generally, is considered to be a self-consistent sequence of operations and/or similar signal processing leading to a desired result. In this context, operations and/or processing involve physical manipulation of physical quantities. Typically, although not necessarily, such quantities may take the form of electrical and/or magnetic signals and/or states capable of being stored, transferred, combined, compared or otherwise manipulated as electronic signals and/or states representing information. It has proven convenient at times, principally for reasons of common usage, to refer to such signals and/or states as bits, data, values, elements, symbols, characters, terms, numbers, numerals, information, and/or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining", "establishing", "obtaining", "identifying", "selecting", "generating", and/or the like may refer to actions and/or processes of a specific apparatus, such as a special purpose computer and/or a similar special purpose computing device. In the context of this specification, therefore, a special purpose computer and/or a similar special purpose computing device is capable of manipulating and/or transforming signals and/or states, typically represented as physical electronic and/or magnetic quantities within memories, registers, and/or other information storage devices, transmission devices, and/or display devices of the special purpose computer and/or similar special purpose computing device. In the context of this particular patent application, the term "specific apparatus" may include a general purpose computing device, such as a general purpose computer, once it is programmed to perform particular functions pursuant to instructions from program software.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change, such as a transformation in magnetic orientation and/or a physical change or transformation in molecular structure, such as from crystalline to amorphous or vice-versa. In still other memory devices, a change in physical state may involve quantum mechanical phenomena, such as, superposition, entanglement, and/or the like, which may involve quantum bits (qubits), for example. The foregoing is not intended to be an exhaustive list of all examples in which a change in state form a binary one to a binary zero or vice-versa in a memory device may comprise a transformation, such as a physical transformation. Rather, the foregoing is intended as illustrative examples.

A computer-readable (storage) medium typically may be non-transitory and/or comprise a non-transitory device. In this context, a non-transitory storage medium may include a device that is tangible, meaning that the device has a concrete physical form, although the device may change its physical state. Thus, for example, non-transitory refers to a device remaining tangible despite a change in state.

While there has been illustrated and/or described what are presently considered to be example features, it will be understood by those skilled in the art that various other modifications may be made and/or equivalents may be substituted, without departing from claimed subject matter. Additionally, many modifications may be made to adapt a particular situation to the teachings of claimed subject matter without departing from the central concept(s) described herein.

Therefore, it is intended that claimed subject matter not be limited to the particular examples disclosed, but that such claimed subject matter may also include all aspects falling within the scope of appended claims and/or equivalents thereof.

The invention claimed is:

1. A method of operating a memory device, comprising:
applying one or more programming electrical pulses to one or more memory cells;
detecting one or more parameters related to a programmed state of the one or more memory cells; and
adjusting one or more aspects of one or more subsequent programming electrical pulses based at least in part on a distribution of the one or more detected parameters.

2. The method of claim 1, wherein the one or more aspects of the one or more subsequent programming electrical pulses comprises one or more of a fall time, a pulse width, or a pulse shape.

3. The method of claim 1, wherein the one or more parameters comprise:
a resistance value related to at least one of the one or more memory cells, a current flow value related to at least one of the one or more memory cells, a programming value related to at least one of the one or more memory cells, a programming state related to at least one of the one or more memory cells, a programming level related to at least one of the one or more memory cells, or some combination.

4. The method of claim 1, wherein detecting the one or more parameters comprises:
applying one or more read voltage signals to the one or more memory cells and detecting one or more currents flowing through the one or more memory cells.

5. The method of claim 1, further comprising:
applying one or more initial programming electrical pulses to the one or more memory cells; and
determining an initial distribution of parameters associated with the one or more memory cells based at least in part on the applied one or more initial programming electrical pulses.

6. The method of claim 5, wherein determining the initial distribution of parameters associated with the one or more memory cells comprises:
determining a plurality of resistance values associated with individual memory cells of the one or more memory cells.

7. The method of claim 5, wherein applying the one or more initial programming electrical pulses to the one or more memory cells comprises:
applying a plurality of discrete programming electrical pulses of varying amplitudes to at least one of the one or more memory cells.

8. The method of claim 1, further comprising:
determining whether the one or more detected parameters each comprise a value less than a range of parameter values associated with memory cells in a reset state.

9. The method of claim 1, wherein detecting the one or more parameters and adjusting the one or more aspects of the one or more subsequent programming electrical pulses are performed on a periodic basis.

10. The method of claim 1, wherein detecting the one or more parameters and adjusting the one or more aspects of the one or more subsequent programming electrical pulses are initiated at least in part by a user.

11. An electronic memory apparatus, comprising:
a memory array including a plurality of memory cells; and
a control unit in electronic communication with the memory array, wherein the control unit is operable to:
detect one or more parameter values related to one or more of the memory cells, and
adjust one or more aspects of a programming electrical pulse based at least in part on the one or more detected parameter values, the one or more aspects of the programming electrical pulse comprising one or more of a fall time, a pulse width, or a pulse shape of the programming electrical pulse.

12. The apparatus of claim 11, wherein the control unit is further operable to apply a plurality of programming electrical pulses having different characteristics to the one or more memory cells.

13. The apparatus of claim 11, wherein the control unit is further operable to measure one or more currents related to individual memory cells of the one or more memory cells to detect one or more resistance values.

14. The apparatus of claim 11, wherein the control unit is further operable to initiate a programming electrical pulse adjustment operation based at least in part on a pre-selected number of memory access cycles.

15. The apparatus of claim 11, wherein the control unit is further operable to initiate a programming electrical pulse adjustment operation based at least in part in response to a detection of one or more memory cell errors.

16. A method of operating a memory device, comprising:
periodically determining differences between a first set of parameter values associated with an array of memory cells and a second set of parameter values associated with the array of memory cells; and
periodically adjusting one or more aspects of one or more programming electrical pulses based at least in part on the periodically determined differences.

17. The method of claim 16, wherein the first set of parameter values comprises a first distribution of resistance values associated with the array of memory cells, and the second set of parameter values comprises a second distribution of resistance values associated with the array of memory cells.

18. The method of claim 16, further comprising:
periodically verifying the one or more periodically adjusted programming electrical pulses at least in part by applying one or more adjusted programming electrical pulses to one or more memory cells of the array of memory cells and by detecting one or more parameter values related to the one or more memory cells based at least in part on the applied one or more adjusted programming electrical pulses.

19. The method of claim 16, wherein periodically adjusting the one or more aspects of the one or more programming electrical pulses comprises:
adjusting, a control unit of the memory device, the one or more programming electrical pulses based at least in part on a received value indicative of a specified slope of a falling edge of a programming electrical pulse.

20. The method of claim 16, wherein periodically determining the differences between the first set of parameter values associated with the array of memory cells and the second set of parameter values associated with the array of memory cells comprises:
applying a plurality of read voltage signal pulses to one or more memory cells of the array of memory cells; and
detecting a plurality of current values of current flowing through individual memory cells of the one or more memory cells.

* * * * *